(12) United States Patent
Martinozzi et al.

(10) Patent No.: US 8,908,436 B2
(45) Date of Patent: Dec. 9, 2014

(54) METHOD AND DEVICE FOR STORING AND READING RELIABLE INFORMATION IN A NAND ARRAY

(71) Applicant: Elpida Memory, Inc., Tokyo (JP)

(72) Inventors: Giulio Martinozzi, Cologno Mozese (IT); Stefano Sivero, Capriate (IT)

(73) Assignee: PS4 Luxco S.A.R.L., Luxembourg (LU)

( * ) Notice: Subject to any disclaimer, the term of this patent is extended or adjusted under 35 U.S.C. 154(b) by 112 days.

(21) Appl. No.: 13/774,756

(22) Filed: Feb. 22, 2013

(65) Prior Publication Data

US 2014/0241059 A1 Aug. 28, 2014

(51) Int. Cl.
G11C 16/04 (2006.01)
G11C 29/04 (2006.01)
(52) U.S. Cl.
CPC ............ G11C 29/04 (2013.01); G11C 16/0408 (2013.01)
USPC ............... 365/185.17; 365/189.05; 365/238.5
(58) Field of Classification Search
CPC ............... G11C 16/0483; G11C 16/10; G11C 16/3418; G11C 16/26; H01L 27/115
USPC .............................. 365/185.17, 189.05, 238.5
See application file for complete search history.

(56) References Cited

U.S. PATENT DOCUMENTS

| 5,067,111 | A | 11/1991 | Asano et al. |
| 2005/0082579 | A1 | 4/2005 | Horii et al. |
| 2007/0109856 | A1 | 5/2007 | Pellicone et al. |
| 2008/0239809 | A1 | 10/2008 | Chae et al. |
| 2012/0155178 | A1* | 6/2012 | Ohta et al. ............... 365/185.17 |

FOREIGN PATENT DOCUMENTS

WO    WO 2011/090680 A1    7/2011

OTHER PUBLICATIONS

European Search Report dated Jul. 1, 2014.

* cited by examiner

*Primary Examiner* — Jason Lappas
(74) *Attorney, Agent, or Firm* — McGinn IP Law Group, PLLC (57) ABSTRACT

A method (and device) includes producing first data in a page region of a memory, the first data including a first number of memory sets, each of the memory sets having a second number of bits, where the first number is a positive number more than one and the second number is a positive number more than three. After the producing the first data in the page region of the memory, second data is produced in response to the produced first data, the second data having the first number of bits, each of the bits of the second data having a logic value that is determined by a majority of the bits included in a corresponding one of the memory sets.

20 Claims, 13 Drawing Sheets

| b | 2*b+1 | D Divisor | Minimum bit set |
|---|---|---|---|
| 1 | 3 | 2,4,8,16… | 4 |
| 2 | 5 | 2,4,8,16… | 8 |
| 3 | 7 | 2,4,8,16… | 8 |
| 4 | 9 | 2,4,8,16… | 16 |
| 5 | 11 | 2,4,8,16… | 16 |

Relationship obtained by the test sequence 901

| page | Number of broken cell | MBS |
|---|---|---|
| 1 | 1 | 4 |
| 2 | 2 | 8 |
| 3 | 0 | 1 |
| 4 | 5 | 16 |
| 5 | 10 | 32 |
| | | |
| 4096 | 3 | 8 |

Example 1 of Configuration Register 902

| page | Number of broken cell |
|---|---|
| 1 | 1 |
| 2 | 2 |
| 3 | 0 |
| 4 | 5 |
| 5 | 10 |
| | |
| 4096 | 3 |

Example 2 of Configuration Register 903

| page | MBS |
|---|---|
| 1 | 4 |
| 2 | 8 |
| 3 | 1 |
| 4 | 16 |
| 5 | 32 |
| | |
| 4096 | 8 |

METHOD AND DEVICE FOR STORING AND READING RELIABLE INFORMATION IN A NAND ARRAY

BACKGROUND OF THE INVENTION

1. Field of the Invention

The present invention generally relates to a fail-free method and device for storing and reading a chunk of information in a non-volatile memory device. More specifically, a NAND flash memory device and method may use its page region having broken bits for correctly storing information with a reduced page size, and an error-free device and method for storing data may use a rule based on a minimum bit set that is chosen using a maximum number of bits failed per data and that is coherent with the data size used in the memory.

2. Description of the Related Art

Each NAND flash memory device usually needs a normal memory to store normal information used by the device user and an additional memory to store configuration information for accessing the memory, such as trimming internal parameters, a bad block address table, and a column fail address table. The configuration information usually is stored at the conclusion of the validation tests, before the memory chip reaches the market.

Some conventional mechanisms for such configuration information storage may use a content addressable memory (CAM) or may use fuses in flash devices. However, the CAM or the fuses may be different in structure from a core memory and may be operated for write, read, and erase differently from the core memory.

A conventional mechanism for such normal information storage may use an EEPROM (Electrically Erasable Programmable Read-Only Memory) to store the normal information. This conventional mechanism may use three EEPROMs such that an EEPROM are cloned three times in order to store reliably the information by storing the same information, and this also may use an analog circuit that makes, during the read phase, a majority check (2 versus 1) to discriminate the correct information if, during the device's life, some bit in the EEPROM fails. However, this conventional mechanism does not disclose to reuse the memory having the broken cells, and does not disclose a specific implemention for a NAND flash memory device, especially using its page region.

Conventionally, it is not possible to use a row NAND page (memory area) to store information when there are columns broken in the row NAND page. Such row page having a broken cell cannot be used for storing correctly data in the conventional device.

Moreover, there is a failed bit correction mechanism such as a redundancy system using a failed address table. However, the failure repair capacity of this mechanism is limited. Especially, a NAND device can be validated only if there are a small number of broken columns and only a few bits fail per byte or word, as detected during testing of the device.

SUMMARY

According to a first exemplary embodiment of the present invention, a method includes producing first data in a page region of a memory, the first data including a first number of memory sets, each of the memory sets having a second number of bits, where the first number is a positive number more than one and the second number is a positive number more than three, and after the producing the first data in the page region of the memory, producing second data in response to the produced first data, the second data having the first number of bits, each of the bits of the second data having a logic value that is determined by a majority of the bits included in a corresponding one of the memory sets.

According to a second exemplary embodiment of the present invention, a device includes a first memory including a memory block which is defined as an erase unit, the memory cell block including a plurality of pages which are defined as a write or read unit, each of the plurality of pages including a plurality of memory cells, a first terminal which receives an address signal which designates a page to be accessed, a second terminal which receives a data signal comprised of n bits (n is integer), a third terminal which receives at least a write command, and a controller configured to respond to the write command to write the data signal of the n bits into the page designated by the address signal, wherein the page is divided into a plurality of sets, so that each of the plurality of sets includes the same number of memory cells, wherein the plurality of sets are grouped only into a first group and a second group, wherein the first group has all the unbroken memory cells, wherein the second group has broken cells and unbroken cells, a number of the unbroken cells is larger than a number of the broken cells, and wherein the controller writes an information corresponding to a bit among the n bits into the memory cells in an associated one of the plurality of sets.

According to still another exemplary embodiment, a method includes determining whether a broken cell exists in each of memory sets included in a memory, the memory sets each including a plurality of cells, when it is determined that a broken cell exists in the each of the memory sets, further determining whether a first number of broken one or ones of the cells in the each of the memory sets is lower than or equal to a second number of unbroken one or ones of the cells in the each of the memory sets, and when it is determined that the first number is lower than or equal to the second number in the each of the memory sets, writing first data into the memory such that each of logic values of the first data is written in the plurality of cells included in a corresponding one of the memory sets.

DETAILED DESCRIPTION OF EXEMPLARY EMBODIMENTS OF THE PRESENT INVENTION

The present inventors have recognized that the testing requirement that each memory device must pass during a test operation in a manufacturing process or a fabrication process can be used to provide a mechanism for reliably storing information. The test operation is, for example, the DUT (device under test). Information to be found in the test operation are, for example, failed addresses that require replacement by cells in a redundancy area of the device, configuration information for trimming internal parameters, a bad block address table, or a column fail address table.

An exemplary method (and device) of the present invention uses a limitation in fails number as an important aspect, the limitation in fails number providing a mechanism to unify a set of bits to memorize a single bit of reliable information. An exemplary method (and device) of the present invention discloses exemplarily how to reliably store a single bit of information in a row NAND page by unifying a set of adjacent bits in a manner. The number of bits selected is chosen to ensure that the possible fail bits are less than good ones.

That is, the present inventors have recognized that, if the testing demonstrates that, for example, no more than one bit line out of three consecutive bit lines tests is bad (i.e., broken or defective), then a single bit (e.g., 1 or 0) of information can be reliably stored in three consecutive bit lines, since the test results for the device show that two bit lines out of the three bit lines will correctly reflect the stored bit value.

Thus, in general, by storing a single bit in a predetermined number of consecutive memory cells, the majority (e.g., two-out-of-three bit lines in this example) of bit lines from these consecutive memory cells will reflect an intended bit value, even if a minority number (e.g., one bit line out of three bit lines in the present example) of bit lines have an incorrect bit value.

Thus, the present invention, when a NAND row page having a broken cell or cells, even before redundancy repair, bad block management, and ECC (error correction code) are used, can store correctly information, by reducing the page size and neglecting the error bits. A simple and quick way to implement this mechanism is a majority-check system on the NAND page region, which associates a single value to each unified set of bits. This value is calculated by determining whether there are more 1's or more 0's read out from inside the chosen set of unified bits.

Referring now to the drawings, and more particularly to FIGS. 1-9, exemplary embodiments of the present invention will be described.

Figure 1:
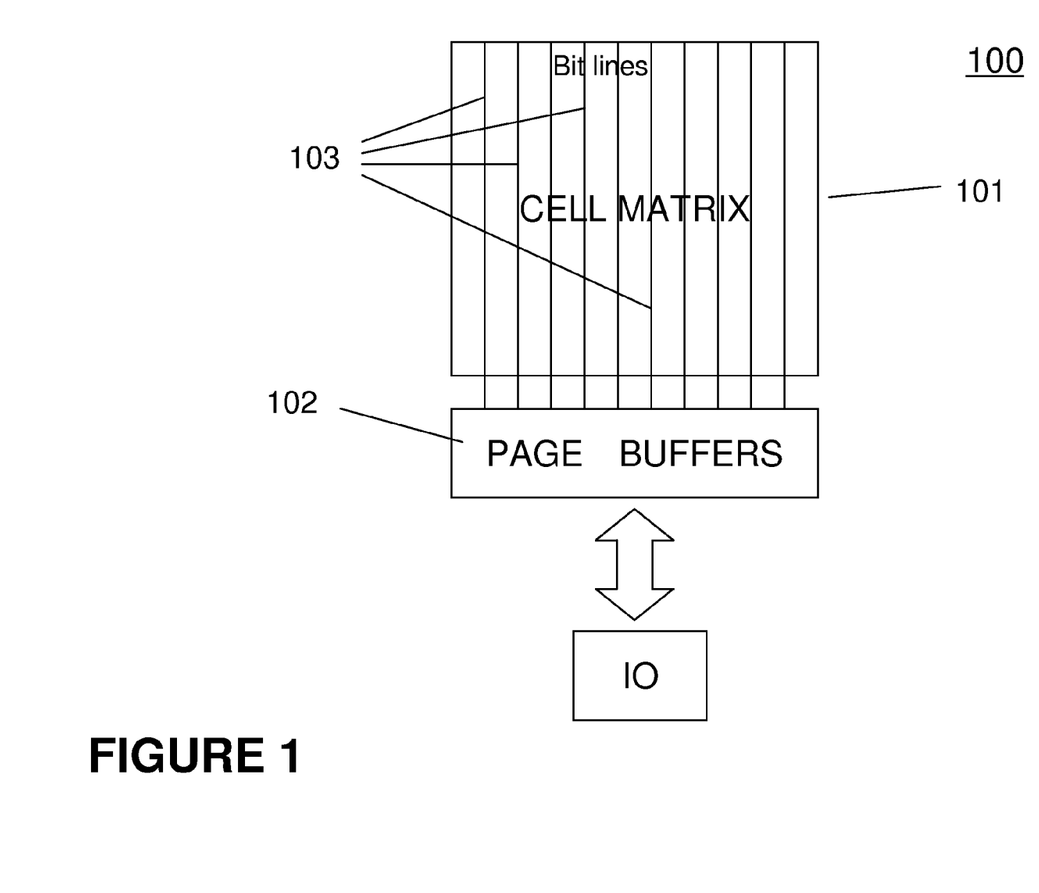
FIG. 1 shows an exemplary NAND flash memory 100.

FIG. 1 shows an exemplary NAND flash memory 100. A NAND flash device includes the NAND flash memory 100. The memory flash memory 100 includes a cell matrix 101 including a plurality of memory cells. Page buffers 102 are coupled to bit lines 103 of the matrix 101 for write and read operations. The IO 104 is coupled to the page buffers 102 to convey data to be written into and read out from the cell matrix 101. The NAND flash memory 100 is made by NAND flash cells.

Figure 1A:
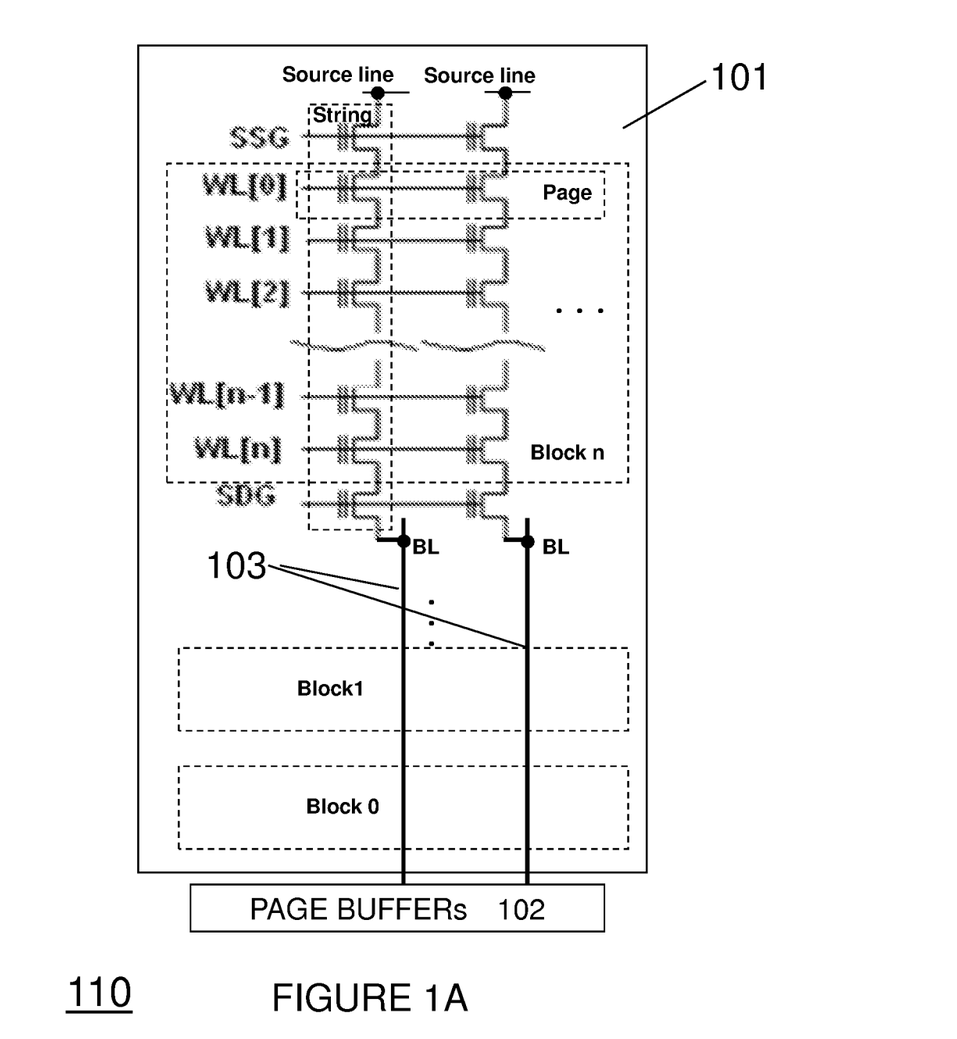
FIG. 1A shows additional details 110 of an exemplary NAND flash memory cell matrix 101.

FIG. 1A shows additional details 110 an exemplary of a NAND flash memory cell matrix 101. The matrix 101 is organized in a plurality (number n) of blocks which includes a plurality of strings. A page buffer 102 is used as a buffering area of data to be written in or to be read out from the memory cells. Each string includes a number n of cells in series and two selectors, one for source side and one for drain side. A multiplicity of strings are connected to the same bit line 103 that is arranged on a first direction and the structure is then repeated on a second direction to reach the full page size, the first and second direction being perpendicular to each other.

The page is the portion of the array addressed at a time for reading and program operations and is structured by a plurality of cells whose gates are coupled to one word line. As a result, each memory array is divided in a number N blocks each including at least one string for each bit line. In a few cases, even and odd bit lines can be addressed separately and belong to different pages, but a page is constituted of cells connected by same word lines. Blocks are addressed selectively and represent the minimum area of memory cells to be biased for each erase operation.

Regarding storage size, the number of columns is called a page size ("P") and usually is a large number of bits (e.g., 4 Kbytes, 2 Kword or more (P=4K), and the data size ("D") is usually the byte or the word, etc. (D=8 in case of a byte, 16 in case of word, etc.). Connected to each column, there is a buffer memory called "Page Buffer" 102 that is the read and write interface circuit.

Figure 2:
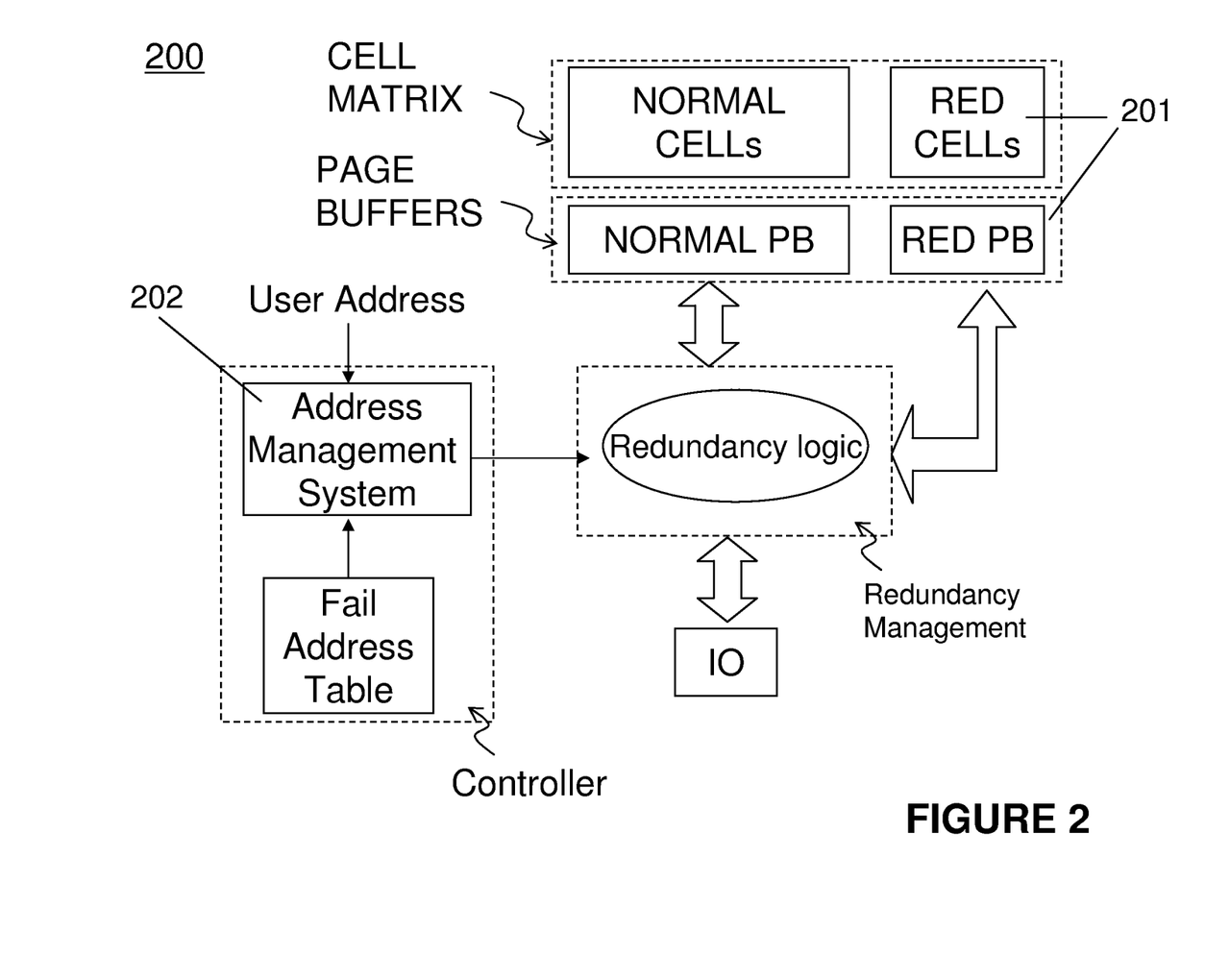
FIG. 2 shows exemplarily using a redundancy system 200 to repair spot defects.

FIG. 2 shows exemplarily the using of a redundancy system 200 to repair defects. In order to repair defect of memory cells, redundancy management is provided in FIG. 2. Also, in a conventional NAND flash, a bad block management and ECC (not shown in figure) are known. The redundancy management mechanism is mainly intended to replace a defective normal cell with a redundant cell, and the bad block manage mechanism is mainly intended to inhibit using a block having defective cells more than its defect repair capacity. The ECC mechanism is mainly intended to correct soft error of a memory cell, by using an error correction code. In the present invention, the NAND page (memory area) having a certain number of defective cells under such condition as explained below in FIG. 3 may be reused, independently of such redundancy management, block management, and ECC. The present invention also may be used in the case that the number of defective cells exceeds the capacity of the redundancy management, the block management, and ECC.

More specifically, regarding the redundancy management, by their nature of being long and tight metal lines, the columns, called bit lines 103, typically have spot defects (e.g., shorts or breaks) which would invalidate the whole memory. In order to repair the spot defects, it is typically provided that a redundancy system logically substitutes a single page buffer and its damaged column with another page buffer-column couple located in an extra small area, called the redundancy area 201, as exemplarily shown in the configuration 200 of FIG. 2. The substitution, completely transparent to the final user, is made by the address management system 202 that, during the user data-in or data-out operation, reads the address of the byte under process, compares it to the list of known defect addresses, and, if matches occur, deviates the information bits according to the table to or from their new location in the redundancy area.

The list of damaged addresses is built up during a chip test in the factory, is permanently stored, for example, in a failed bit address table of the controller 202, in the device, and may include at least an array of records, each one storing the broken address and the broken bit position inside the data.

Since one cannot repair any bit in any page position because one would need a redundancy area as large as the main memory, some assumptions are made, in order to trade off between redundancy waste of area and redundancy correction power.

Therefore, in this strategy, one would choose to correct only a limited number of addresses ("N") and a limited number of bits inside the data ("b"), since, if there are too many defective addresses or too many defects inside the data, the chip will be discarded. These numbers (e.g., values) typically are chosen and fixed at the beginning of the design project according to the technology reliability and marketing constraints.

For example, a redundancy rule might be to choose to repair only 128 addresses in a page of 4 Kbytes and only 1 bit per byte (P=4096, D=8, N=128, b=1). In this case, the fail address table would be N-times the array with the address of the broken column (log 2(P)), the addresses of each broken bit (b*log 2(D)) and, eventually, a flag for each broken bit (b), N*(log 2(P)+b*log 2(D)+b), 128*(12+3+1)=2048 bits in this example. Conventionally, it is impossible to use the page (row memory area) without the correction when the page has a defective cell or cells, because, due to the defects, some bits are stacked "0" or "1". Thus, one cannot write and read correctly information by using such the defective page.

However, the present invention provides a mechanism to accomplish the write and read correctly, even with such the defective page (row memory area). With the exemplary error-free system of the present invention to store data, it is possible to reduce the actual page size according to the particular redundancy rule chosen and thus neglect the defects.

Figure 3:
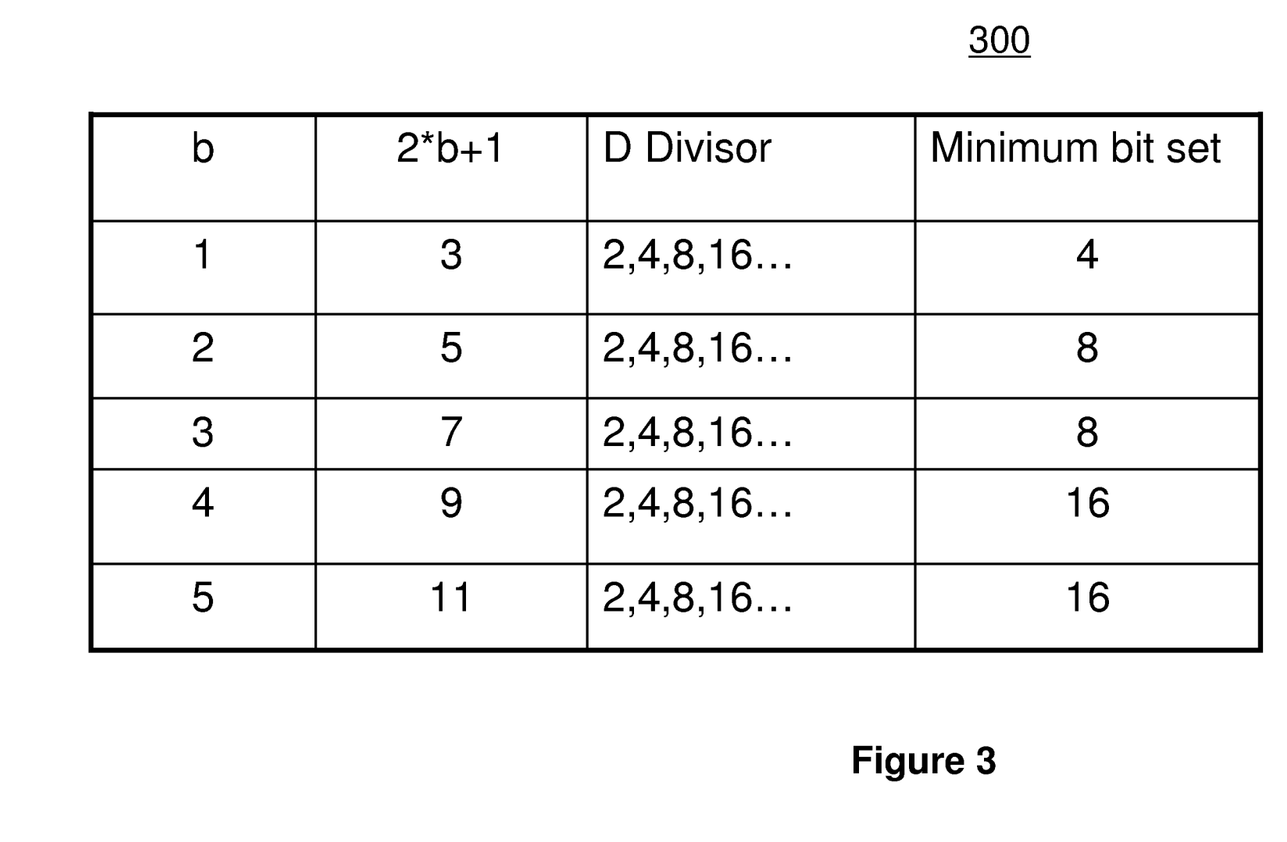
FIG. 3 shows a table 300 that demonstrates a concept of minimum bit set (MBS)

FIG. 3 shows a table 300 that demonstrates a concept of "minimum bit set" (MBS). The MBS table 300 is newly provided in the present invention, and may be stored in a tester or inside of the NAND device. The table 300 may be used in the test of the memory device.

If the redundancy rule fixes a maximum of "b" bits fail per data, and the chip is correctable, then this means that the density of error is less than "b/D". If one wants to be sure to select a set where bad bits are less than good ones, then one would need more than "2*b+1" bits' number. But this number should also be at least the upper closer divisor of data size D, in order to avoid incoherency between chosen set periodicity and data periodicity in the page.

Figure 4:
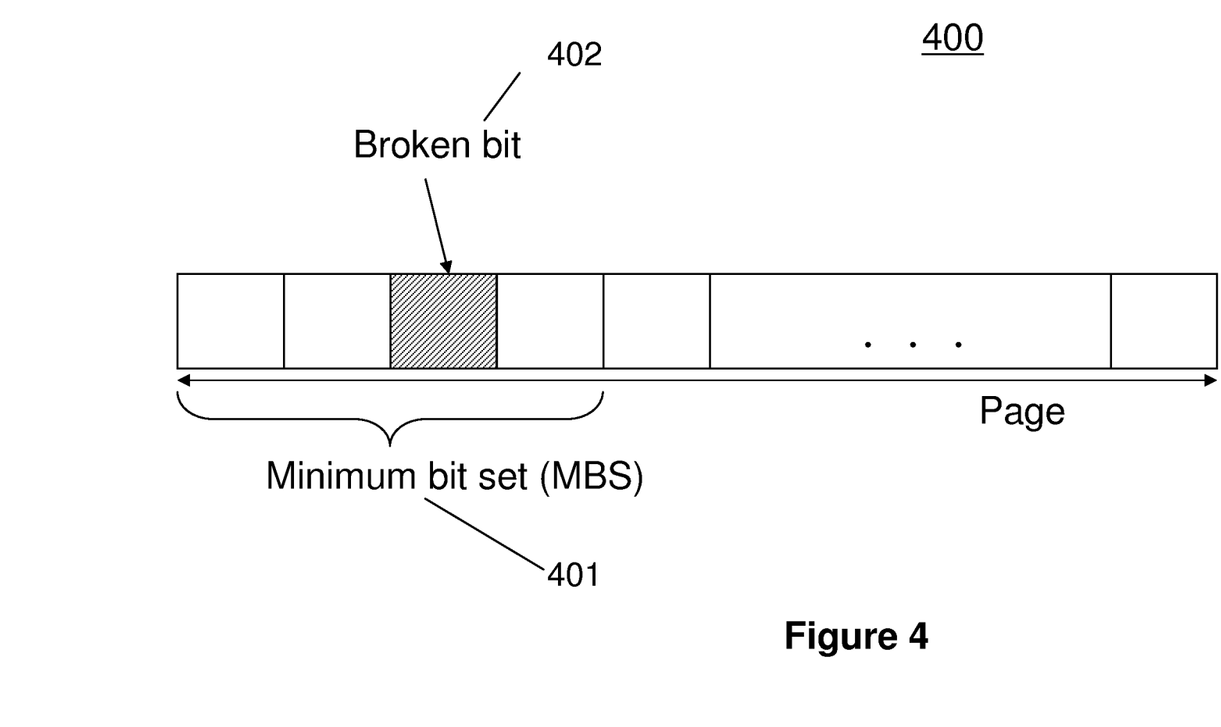
FIG. 4 shows exemplarily how the MBS concept 400 provides a reliable storage of a single bit of information, even in view of one or more corrupted bits, by reason of majority representation of the intended bit.

As an example from the table 300 in FIG. 3, in the case of b=1, it is possible to logically unify 3 bits, but one should choose at least 4 bits as the MSB, to be coherent with data storage based on bytes of data having 4 bits, as shown by byte size 401 of the page 400 shown exemplarily in FIG. 4. Accordingly, one will then be certain that in this set only 1 bit can be bad, and in case of a majority-check read, 3 bits (good) will win over 1 bit (bad), and the information read out from the 3 good bits is correctly brought out, neglecting the value of the broken bit 402.

Figure 5:
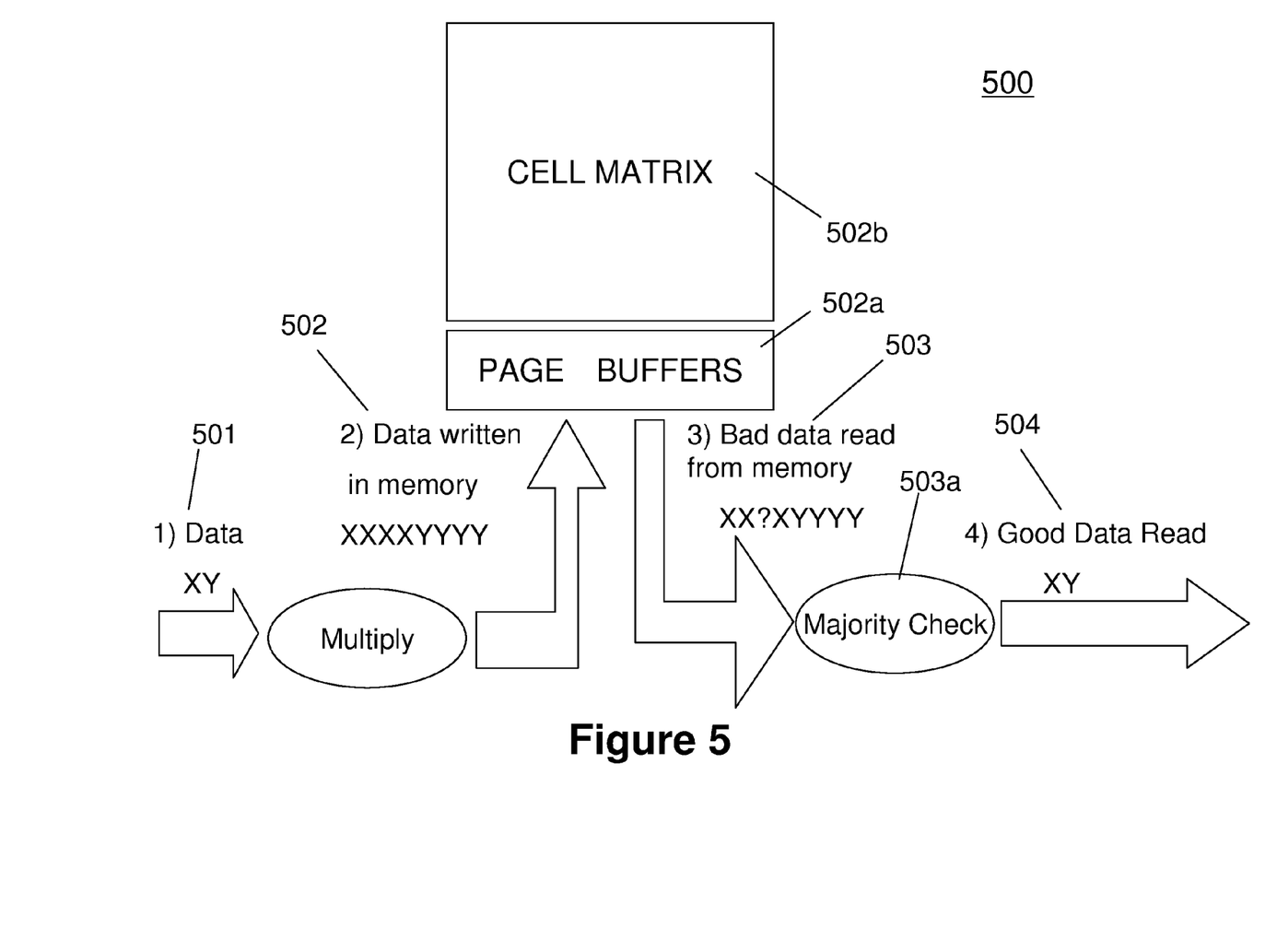
FIG. 5 shows exemplarily a "majority check" mechanism 500 for reading information in storage areas of the present invention.

FIG. 5 shows exemplarily a "majority check" mechanism 500 for reading information in storage areas of the present invention.

In one example, one can use a set of 4 bits for the majority check according to the MSB shown in table 300 of FIG. 3. By using a page (4 Kbyte) of memory area with errors, one can access to a 4 KB/4=1 KB of error-free area to store reliable information.

This kind of data can be programmed using the same Page buffer block loaded with XXXXYYYY bit data type and read out through the majority check circuit 503a as good XY bits, as shown in the diagrammatic flowchart format 500 of FIG. 5.

In step 501, two bits of data "YX" are provided in the device, for example at the IO of the device.

In step 502, two bits of data "YX" are multiplied to produce eight bits of another data "XXXXYYYY". The eight bits are written via the page buffer 502a into the matrix 502b.

In step 503, the eight bits are read via the page buffer 502a from the matrix 502b. The third bit of the data that has been read from the matrix is broken, which indicates "?" in the output data.

At this time, the majority check, step 504, is performed on the read data including the broken bit in order to obtain a correct bit. In the result of the majority check, two bits of data "Good data XY" are obtained.

More specifically, consider a case in which the (1) data is 01 and the (2) data is 00001111. When the data is read, the (3) data is 00?01111, where the bit "?" may indicate erroneously a value of "1". If so, then 00010111 is read. A majority of the first four bits "0001" is 0, so that 0 is obtained and also a majority of latter four bits "0111" is 1 so that 1 is obtained. In this way, 01 is finally obtained.

In view of the majority check, this operation can be done by using three bits versus one bit. However, in the case that such a detection as finding the broken bit per 4 bits or a multiple of 4 is used, the above-introduced four bits majority preferably is to be used. This is because in this case, if the three bits majority was used, then some fails may occur. The serial bits "0"-"0"-"0"-"1" (broken)-"1" (broken)-"0"-"0"-"0"-"0"-"0"-"0" ... comprise at most one broken cell in each of the four bits. By using the three bits majority check, these serial bits are wrongly read as 010. However, by using the four bits majority check, this error does not occur and the "000 . . ." can be obtained. Thus, the minimum bit set for the multiply and majority check should be chosen according to a number of broken bit(s), which is indicated by FIG. 3.

Additionally, in the case of data 0011, 0101, 1001, 1100, and 1010, wherein there are equal numbers of "1" and "0", the final bit is neglected in the exemplary four bit majority check, so that the output from these five data readings will be respectively 0, 0, 0, 1 and 1.

Thus, the 1 KB error-free page can be used to store important information.

In one example, the error-free page may be used to store configuration and the redundancy Fail address table itself, which is 2048 bits large, because one does not need the redundancy information when performing a majority-check read. This feature is particularly useful in the power-on sequence of the whole device, when through the first majority-check read the fail address table and the programmed custom configuration can be read from a standard matrix page and copied into a battery of latches ready to be used at a first user operation.

Thus, an advantage of the present invention is that one can avoid the use of a dedicated storing system for this kind of information, such as fuses or a content-addressable memory (CAM) array used in conventional architectures.

In another example, the error-free page may be used after the block has been judged as the bad block. Conventionally once the bad block becomes bad, the block is inhibited to be used, but in this present invention, a page inside of such the bad block may be reused for data storage, as long as the defect of the page appears by following the condition of the table 300 such as explained above.

Figure 6:
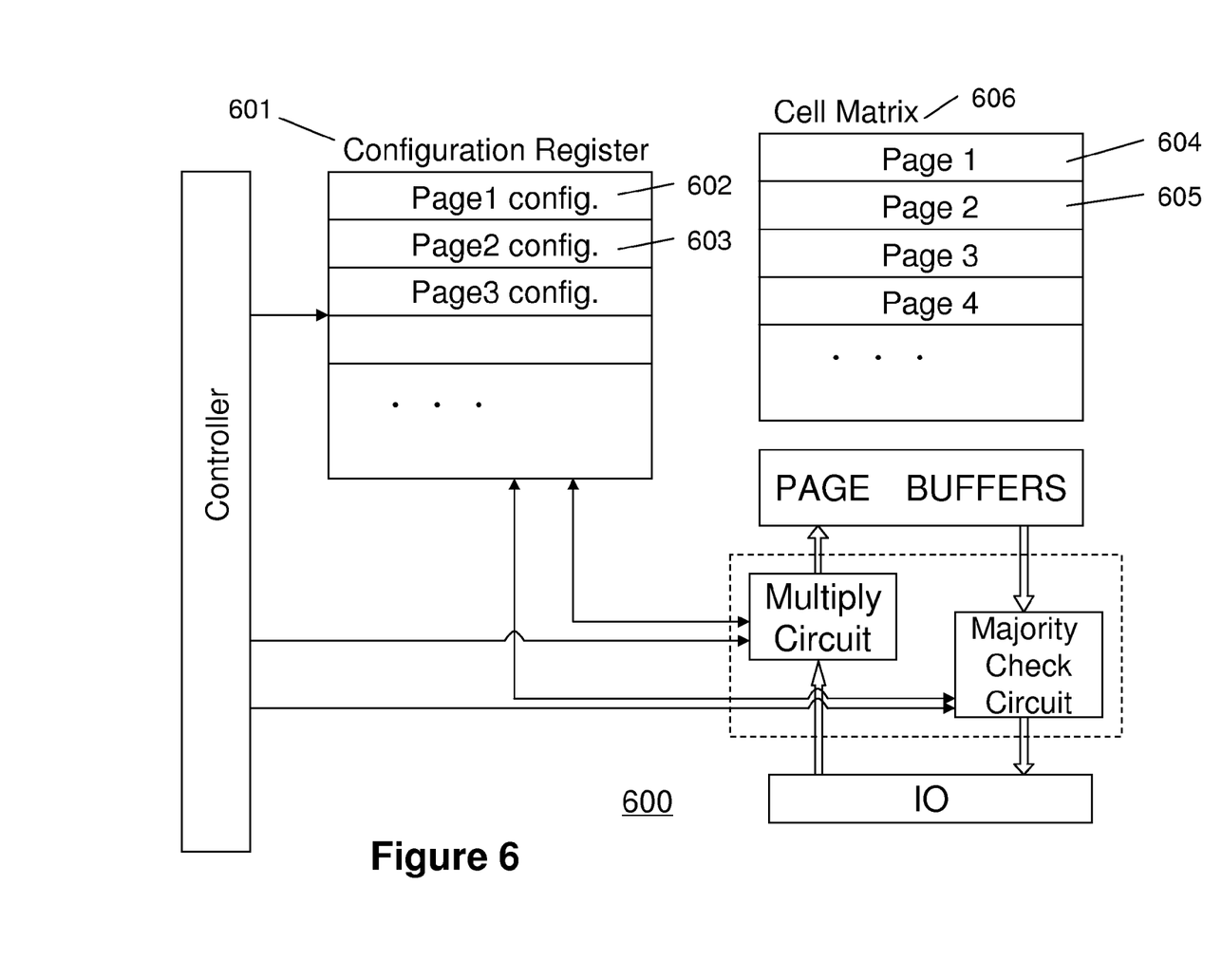
FIG. 6 shows an exemplary configuration 600 of circuit blocks that implement concepts of the present invention.

FIG. 6 shows an exemplary configuration 600 of circuit blocks for implementing the above-introduced operation. The configuration register 601 stores configuration data 602, 603. The configuration data 602, 603 may include a plurality of data each of which corresponds respectively to one of page regions 604, 605 of the cell matrix 606. The configuration data indicates which "minimum bit set" shown in FIG. 3 should be used in order to read data correctly from a corresponding one of the page regions 604, 605.

For example, if the page 1 configuration data 602 indicates b=2 which is the case "at most two broken cell per eight cells", then eight bits are chosen as the minimum bit set. If the page 2 configuration data 603 indicate b=1 which is the case "at most one broken cell per four cells", then four bits are chosen as the minimum bit set.

The multiply circuit is a circuit that performs the multiply shown in FIG. 5. The majority check circuit is a circuit that performs the majority check of shown in the FIG. 5. The circuits are controlled respectively by a control signal supplied from the controller.

It is noted that, from the above description, the present invention may use the page region (page buffers) of NAND flash memory device, in order to write and store multiplied data in series therein and read the data. As explained above, the page region is a write unite and a read unit in a NAND device, thus the multiply and majority check of the present invention is performed on this same page region.

It is noted that, in the present invention, the page region that has broken bits can be used in order to store correctly information, as long as the broken bits appear under the above-explained condition.

Figure 7:
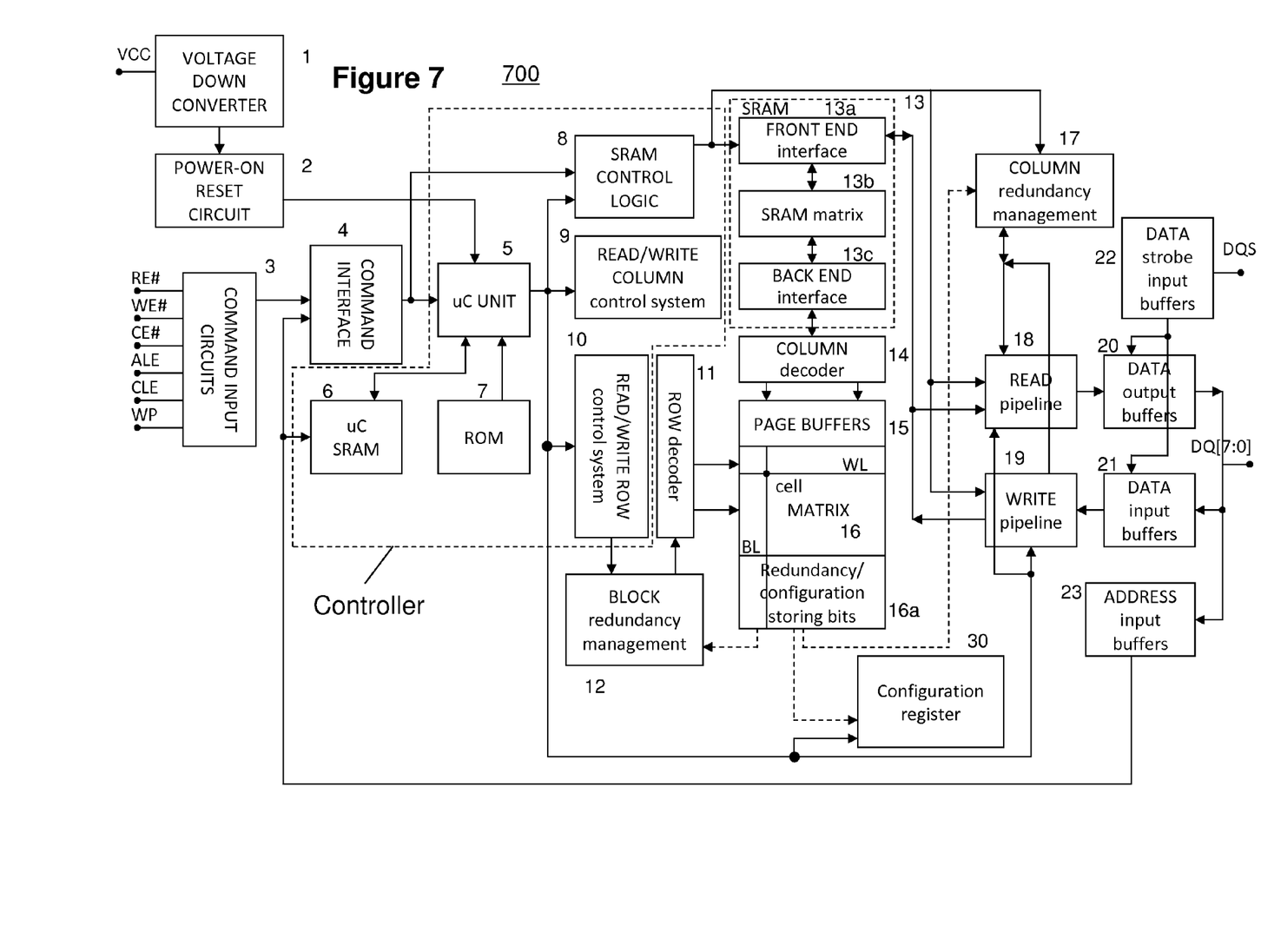
FIG. 7 shows an exemplary NAND architecture 700 that incorporates the present invention.
Figure 7A:
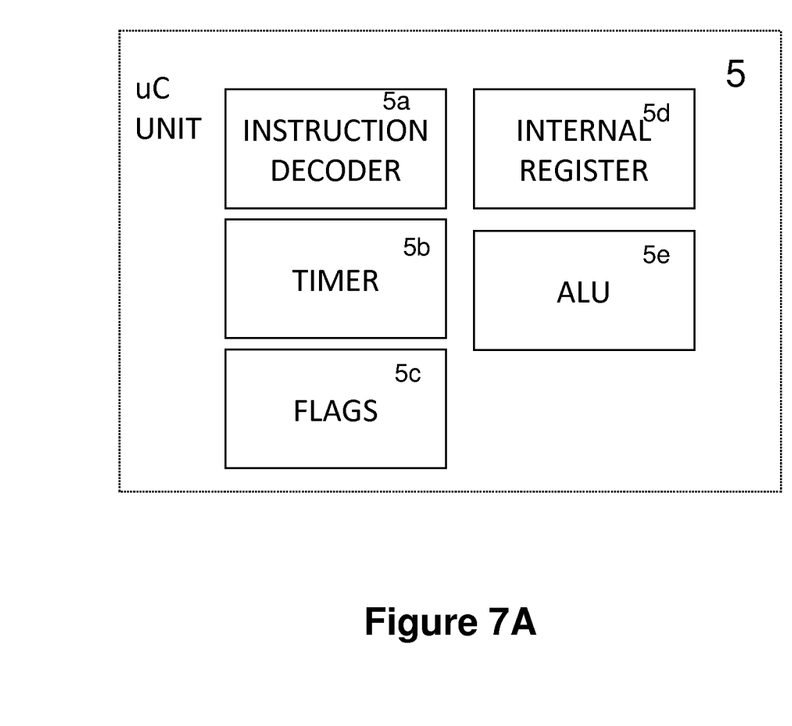
FIG. 7A provides additional details of the microcontroller (μC) 5 of FIG. 7.
Figure 7B:
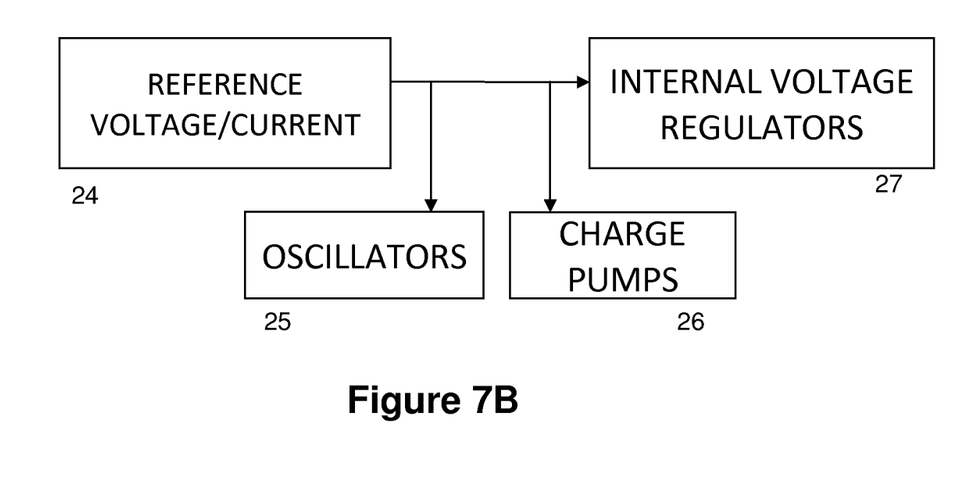
FIG. 7B provides additional details of the power supply circuits of FIG. 7.
Figure 7C:
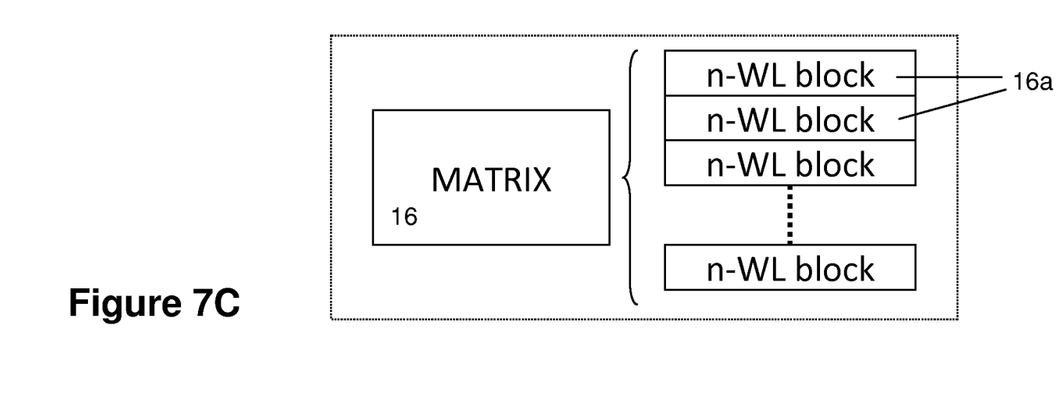
FIG. 7C provides additional details of the main cell matrix 16 of FIG. 7.

FIG. 7 shows an exemplary overall architecture 700 of a NAND-based flash memory device incorporating the concepts of the present invention, with FIGS. 7A-7C showing additional details of various portions of the device. On the left side, command input circuits block 3 shows the I/O circuitry (input and output buffers). The signals from command input circuits block 3 enter the block 4 (command interface) which is in charge of decoding a command sequence (e.g., read, program, erase . . . ) and enabling the microcontroller (µC) unit 5 and the front end logic 8 to load/read into/from SRAM 13 the data pattern that will be written/read into/from the core matrix 16.

The microcontroller µC 5, as exemplarily shown in more detail in FIG. 7A, executes NAND algorithms stored in the ROM block 7. In test mode operations, the code can be also executed from the µC SRAM 6. Note that this µC SRAM 6 is different from the user SRAM 13.

The core matrix 16 is accessed through the row and column decoders 11,14 that properly bias the word lines and the bit line voltages, passing through the page buffers 15.

The READ/WRITE column control system 10 is digitally controlled by the µC 5 and manages the analog voltages provided by the internal voltage regulator block 27 (see FIG. 7B) that are needed to access the NAND-based memory 16.

FIG. 7B exemplarily shows additional power supply components 24-27 used to supply regulated power to the circuit 700 shown in FIG. 7.

On the right side of FIG. 7, the output buffers 20, 22 and the related circuitry are depicted, including data input/output terminals DQ[7:0].

The matrix 16 is exploded in FIG. 7C, showing the pages 16a discussed above as an object of fabrication testing.

The present invention involves particularly the following blocks BACK END INTERFACE 9, COLUMN DECODER 14, PAGE BUFFERS 15, MATRIX PAGES 16a, CONFIGURATION REGISTER 30, COLUMN REDUNDANCY MANAGER 17, and blocks used in a standard read process.

Figure 7D:
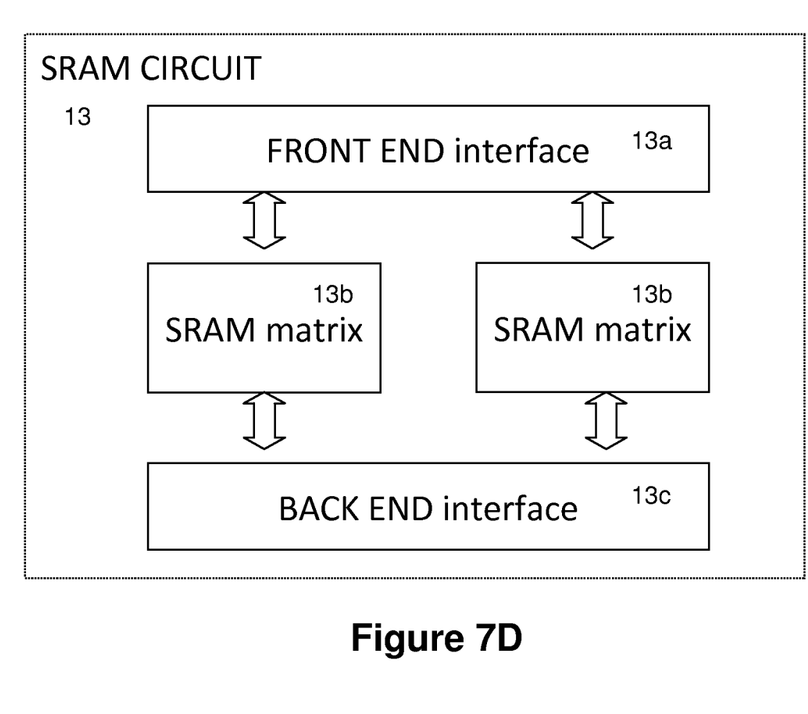
FIG. 7D provides additional details of the SRAM circuit 13 of FIG. 7.

FIG. 7D exemplarily shows additional details of the SRAM circuit 13, including an exemplary configuration using two SRAM matrix blocks 13b in addition to the FRONT END interface 13a and BACK END interface 13c.

Figure 8:
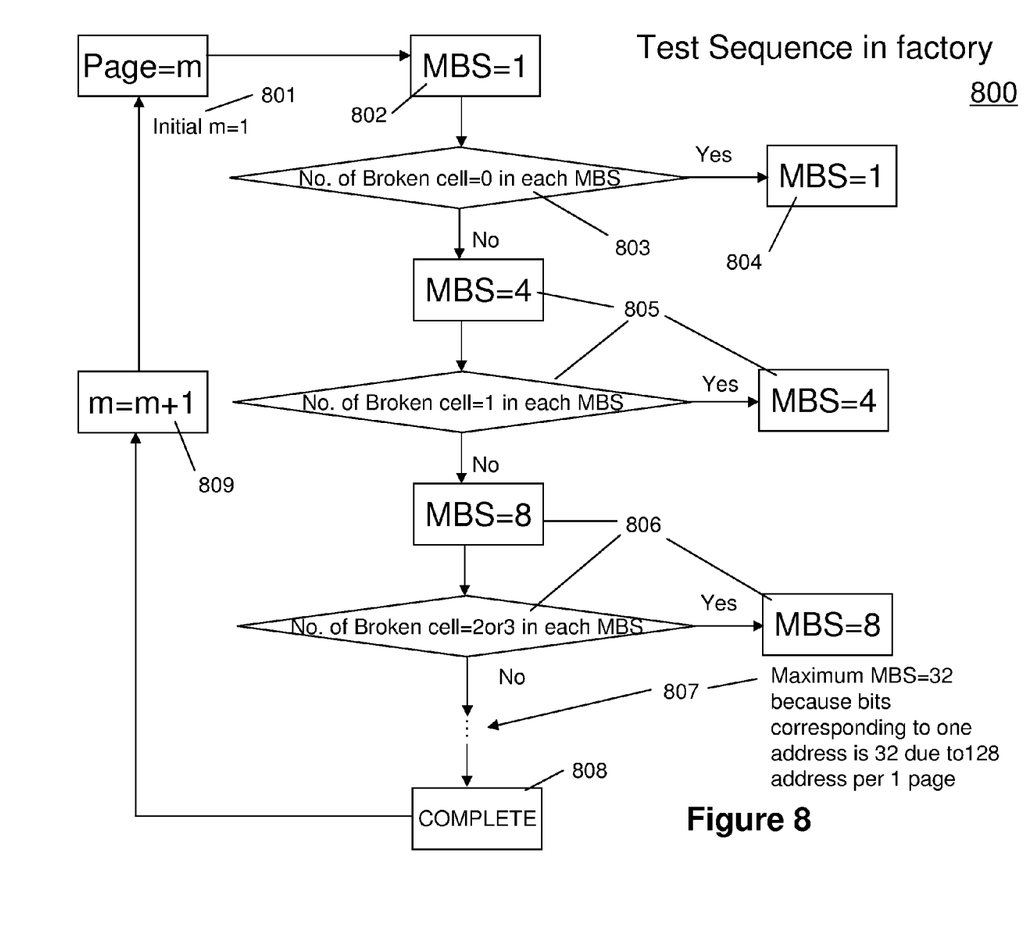
FIG. 8 shows an exemplary flowchart 800 for storing configuration data to a configuration register 30.

FIG. 8 exemplarily shows a flow to store configuration data to the configuration register 30 of the present invention. The flowchart 800 permits the configuration of each page to be measured, for example, in a test at a factory.

In initial step 801, a first page is tested for the number of defects, initially presuming, in step 802, that MBS=1. If no defects are found (step 803), then the value of MBS for that page is set to 1 (step 804). If more than 0 defects are found (step 803), then the process sequences to step 805, to check if MBS should be set to 4 (1 defect found), and, if needed, in step 806, advances to MBS=8 (i.e., 2 or 3 defects found). If needed, in step 807, additional MBS values are explored, with a maximum possible MBS value being 32. Once the MBS is determined for that page, the next page is tested by advancing the page counter (steps 808, 809).

Figure 9:
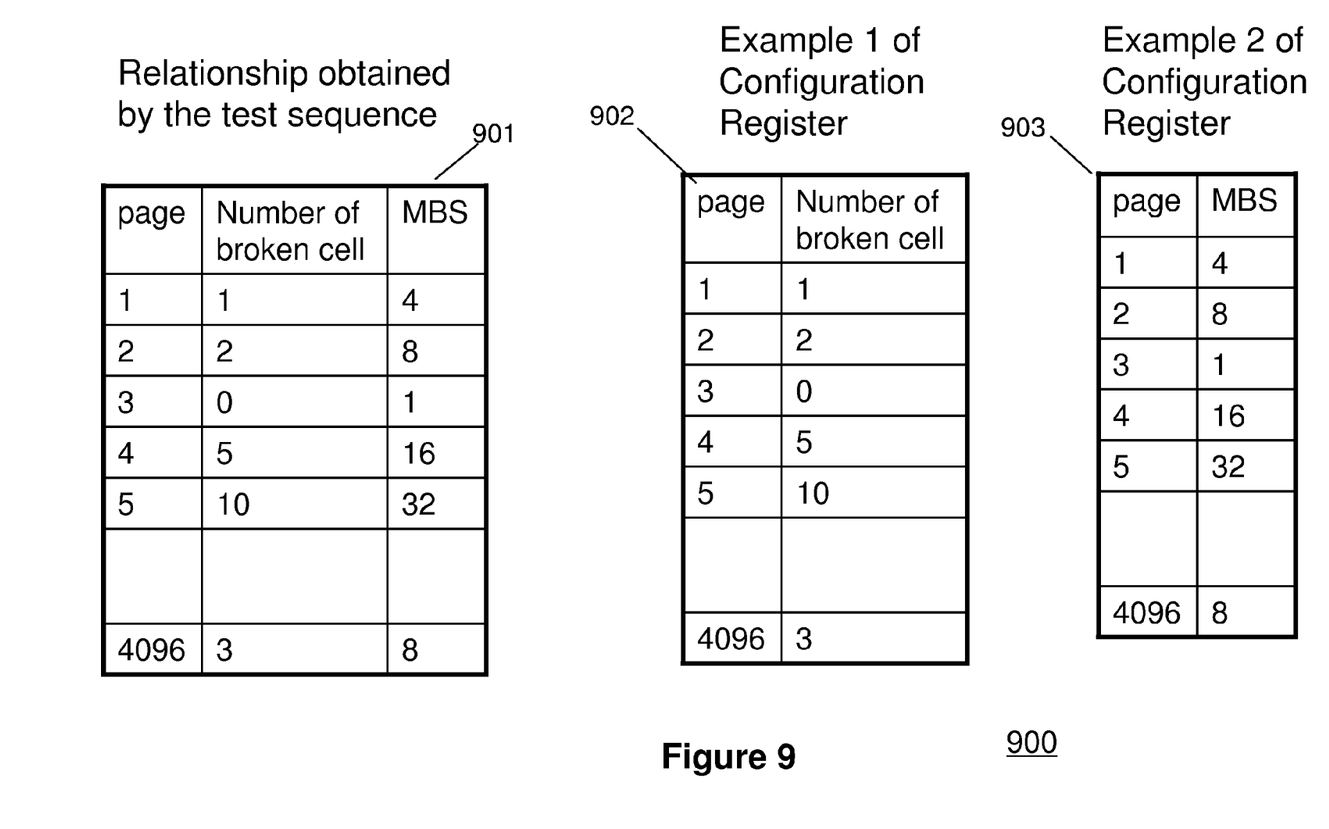
FIG. 9 exemplarily shows specific examples of configuration data stored in the configuration register 30.

FIG. 9 exemplarily shows specific examples 900 of how the configuration data can be stored in the configuration register (30 in FIG. 7). The test relationships are exemplarily shown in table 901. In the example 1 configuration 902, the configuration data are the position of the page and a number of the broken cell(s) of the page. In the example 2 configuration 903, the configuration data are the position of the page and the minimum bit sets. It should be clear to one having ordinary skill in the art that either Example 1 or Example 2 provides sufficient information to implement, for each page listed (e.g., 1 through 4096), the MBS and majority check mechanisms described in the present invention.

While the invention has been described in terms of an exemplary embodiment, those skilled in the art will recognize that the invention can be practiced with modification within the spirit and scope of the appended claims.

Further, it is noted that Applicant's intent is to encompass equivalents of all claim elements, even if amended later during prosecution.

What is claimed is:

1. A method comprising:
   producing first data in a page region of a memory, the first data comprising a first number of memory sets, each of the memory sets having a second number of bits, where the first number is a positive number more than one and the second number is a positive number more than three; and
   after the producing the first data in the page region of the memory, producing second data in response to the produced first data, the second data having the first number of bits, each of the bits of the second data having a logic value that is determined by a majority of the bits included in a corresponding one of the memory sets.

2. The method of claim 1, further comprising:
   before the producing the first data in the page region of the memory, multiplying third data to produce the first data, the third data having the first number of bits, each of the bits of the third data having a same logic value as a corresponding one of the memory sets of the first data.

3. The method of claim 1, further comprising:
   performing a redundancy operation on the memory to replace a defective one of the cells with one of redundancy cells of the memory.

4. The method of claim 1, further comprising:
   if the majority of the bits included in a memory set is even, not considering one logic value indicated by one of the bits of the memory sets to determine, as the second data, a logic value.

5. The method of claim 1, further comprising:
   reading the first data from the page region of the memory to produce the second data in response to the produced first data.

6. The method of claim 5, further comprising:
storing the second data in another memory different from the memory.

7. The method of claim 1, wherein the memory comprises a NAND type flash memory.

8. A device comprising:
a first memory including a memory block which is defined as an erase unit, the memory cell block including a plurality of pages which are defined as a write or read unit, each of the plurality of pages including a plurality of memory cells;
a first terminal which receives an address signal which designates a page to be accessed;
a second terminal which receives a data signal comprised of n bits (n is an integer);
a third terminal which receives at least a write command; and
a controller configured to respond to the write command to write the data signal of the n bits into the page designated by the address signal,
wherein the page is divided into a plurality of sets, so that each of the plurality of sets includes a same number of memory cells,
wherein the plurality of sets are grouped only into a first group and a second group,
wherein the first group has all the unbroken memory cells,
wherein the second group has broken cells and unbroken cells, a number of the unbroken cells being larger than a number of the broken cells, and
wherein the controller writes an information corresponding to a bit among the n bits into the memory cells in an associated one of the plurality of sets.

9. The device of claim 8, wherein the controller is further configured to respond a read command to read data from the page designated by the address signal,
wherein the controller performs a majority check on the designated page when reading the data from the designated page.

10. The device of claim 8, further comprising:
a second memory storing configuration data each associated with one of the pages, the configuration data being used when the controller write or read data.

11. The device of claim 10, wherein the configuration data includes data determined in response to a number of the broken cells in the second group.

12. The device of claim 10, further comprising a third memory storing address information that addresses a broken one of the cells of the first memory.

13. The device of claim 10, further comprising a SRAM memory array storing data communicated with the first memory.

14. A method comprising:
determining whether a broken cell exists in each of memory sets included in a memory, the memory sets each including a plurality of cells;
when it is determined that a broken cell exists in the each of the memory sets, further determining whether a first number of broken one or ones of the cells in the each of the memory sets is lower than or equal to a second number of unbroken one or ones of the cells in the each of the memory sets; and
when it is determined that the first number is lower than or equal to the second number in the each of the memory sets, writing first data into the memory such that each of logic values of the first data is written in the plurality of cells included in a corresponding one of the memory sets.

15. The method of claim 14, further comprising:
reading the first data from the memory to produce second data, such that each of the bits of the second data has a logic value that is determined by a majority of the bits included in a corresponding one of the memory sets of the first data.

16. The method of claim 14, further comprising:
providing control data in response to a maximum number among numbers of broken cells included in the each of the memory sets.

17. The method of claim 16, further comprising:
choosing a size of a memory set in response to the provided control data, so that a number of the cells included in the each of the memory sets changes.

18. The method of claim 17, wherein when the size of the memory set is four bits, the maximum number among the numbers of the broken cells included in the each of the sets is one.

19. The method of claim 14, wherein the memory comprises a NAND memory array and wherein the memory sets of the memory configures a page of the NAND memory array.

20. The method of claim 14, further comprising:
performing a redundancy operation on the memory to replace a defective one of the cells with one of redundancy cells of the memory.

* * * * *